United States Patent [19]

Smith-Vaniz et al.

[11] Patent Number: 4,795,973
[45] Date of Patent: Jan. 3, 1989

[54] LINE MOUNTED APPARATUS FOR MEASURING LINE POTENTIAL

[75] Inventors: William R. Smith-Vaniz, Darien; John R. Montgomery, Fairfield, both of Conn.

[73] Assignee: Niagara Mohawk Power Corporation, Syracuse, N.Y.

[21] Appl. No.: 174,965

[22] Filed: Mar. 29, 1988

Related U.S. Application Data

[63] Continuation-in-part of Ser. No. 669,589, Nov. 8, 1984, abandoned, Ser. No. 564,924, Dec. 23, 1983, Pat. No. 4,635,055, and Ser. No. 484,681, Apr. 13, 1983, Pat. No. 4,689,752.

[51] Int. Cl.$^4$ .............................................. G01R 1/04
[52] U.S. Cl. ..................................... 324/126; 364/492
[58] Field of Search ........... 324/126, 127, 109, 123 R, 324/72; 364/492

[56] References Cited

U.S. PATENT DOCUMENTS

| | | |
|---|---|---|
| 2,900,597 | 8/1959 | Gooding . |
| 3,428,896 | 2/1969 | Schweitzer, Jr. . |
| 3,524,133 | 8/1970 | Arndt . |
| 3,633,191 | 1/1972 | Enge et al. . |
| 3,686,569 | 8/1972 | Neilsen . |
| 3,932,810 | 1/1976 | Kohler et al. . |
| 3,939,412 | 2/1976 | Hermstein et al. . |
| 3,969,671 | 7/1976 | Smith . |
| 4,052,665 | 10/1977 | Gruenwald . |
| 4,090,130 | 5/1978 | Willenbecher, Jr. . |
| 4,121,154 | 10/1978 | Keating . |
| 4,158,810 | 6/1979 | Leskovar . |
| 4,268,818 | 5/1981 | Davis et al. . |
| 4,384,289 | 5/1983 | Stillwell et al. . |
| 4,503,389 | 3/1985 | Singer . |
| 4,611,207 | 9/1986 | Anderson et al. . |

FOREIGN PATENT DOCUMENTS 3009997 10/1981 Fed. Rep. of Germany . .

Primary Examiner—Reinhard J. Eisenzopf
Assistant Examiner—Edward Urban
Attorney, Agent, or Firm—Lalos & Keegan

[57] ABSTRACT

A self contained hot stick mounted radio transmitting module may be permanently mounted on or temporarily pushed against the power conductor of an electrical transmission line. The module is capable of measuring the potential difference between the conductor and ground. The module digitizes and transmits the value of the potential difference to a ground receiver. The module is donut shaped and opens like a pair of jaws. The contact with the power line is accomplished via a resilient conductive elastomer that covers the surfaces in contact with the power conductor. The potential difference between ground and the power conductor is measured with an operational amplifier in an integrating configuration to convert the leakage current from the module to ground into a proportional voltage from a low impedance source. The integrator outputs a voltage proportional to the current flowing into the equivalent capacitance formed by the outer surface of the module and ground. The current is generated by the voltage difference between the power conductor and ground. The power conductor is engaged by a pair of jaws inserts comprising two concentric conducting rings separated by a thin insulating layer forming a large capacitor. The electronic components within the unit are protected by a signal conditioning network to preclude destruction of components in the event of lightning strikes or other overvoltage conditions.

10 Claims, 9 Drawing Sheets

LINE MOUNTED APPARATUS FOR MEASURING LINE POTENTIAL

CROSS-REFERENCE TO RELATED APPLICATIONS

This application is a continuation-in-part of pending U.S. application Ser. No. 669,589, filed Nov. 8, 1984 now abandoned, U.S. application Ser. No. 564,924, filed Dec. 23, 1983, now U.S. Pat. No. 4,635,055, and U.S. application Ser. No. 484,681, filed Apr. 13, 1983, now U.S. Pat. No. 4,689,752. This application is also related to U.S. Pat. No. 4,384,289. U.S. Pat. Nos. 4,635,055, 4,689,752, and 4,384,289 are incorporated herein by reference.

BACKGROUND OF THE INVENTION

This invention relates to line mounted apparatus for measuring line potential. More particularly, this invention relates to the measurement of high power, alternating current (AC), transmission line voltages. This invention employs power line mounted, radio transmitting, electrically isolated modules. Preferably, the modules are mounted on all power conductors connected to the load to be monitored.

Each module contains apparatus for measuring the instantaneous voltage associated with the power conductor upon which the module is installed. The measured instantaneous voltage is derived from the potential difference induced by the electric field associated with the power line upon the outer toroidal structure of the module.

The novel voltage measuring apparatus disclosed herein makes possible the use of the module as a hot stick mounted power line voltage probe.

High power, AC, transmission line potentials have been typically measured by the use of step down isolation voltage transformers where one end of the primary high voltage winding was conductively coupled to the high voltage line. The existence of a direct conductive link between the high voltage passing through the power line and ground typically exposed the voltage measuring equipment to high voltage stresses especially when hit by lightning strikes. The continual exposure to such high voltage stresses necessitated bulky and therefore expensive construction of such voltage measuring equipment to assure reliable operation and operator safety over extended periods of time.

It is desirable to measure potential values along the power line for short periods or continually at arbitrary positions. This measured voltage can be used to derive Fourier frequency components, power, and power factor information associated for the operation of the power line being measured, and to locate and diagnose anomalies in the use and transmission of electric power.

Various power line sensors have been disclosed in the prior art. For example see U.S. Pat. Nos. 3,438,896, 3,633,191, 4,158,810 and 4,268,818. It has been proposed to use sensors of this type and of the greatly improved form disclosed in U.S. Pat. No. 4,384,289 for dynamic line rating of electrical power transmission lines. An improved line voltage sensor was disclosed in the above-identified application Ser. No. 484,681, now U.S. Pat. No. 4,689,752. Specifically, line voltage was derived from the ratio of voltages between two series capacitors; one formed by the internal structure of the module while the second was formed between the outer skin of the module and ground. However, the former capacitance was found to change value due to the influence of conductive debris on the structure forming the capacitor, and the proximity of high voltage gradients associated with the power line. This change can alter the value of the ratio of the two capacitances and degrade the accuracy of the voltage measurement.

It is therefore an object of the invention to provide apparatus for measuring the instantaneous potential difference between ground and a power line conductor.

Another object of the invention is to provide apparatus of the above character which is hot stick mounted.

A further object of the invention is to provide apparatus of the above character capable of transmitting measurements to ground.

Still another object of the invention is to provide apparatus of the above character which may be left on the power conductor for an indefinite time.

Yet another object of the invention is to provide apparatus of the above character that is not subject to error caused by varying weather conditions.

SUMMARY OF THE INVENTION

The present invention for measuring voltage of high power AC transmission lines comprises an electronic module contained within a metallic enclosure in the proximity of the power line. The present invention measures, digitizes, and transmits the actual instantaneous value of voltage to a remote receiver. Such a configuration avoids the requirement of bulky insulation to accommodate the high voltages associated with power line operation. This is accomplished by the interposition of a radio link instead of the typical direct conductive connection to ground from the power line.

The voltage measuring system shown in FIG. 1 has no direct, highly conductive link between the high voltage of the power line 3 and ground through the measuring device. The voltage measurement is encoded and transmitted via radio frequency energy from the measuring device, namely a toroidal state estimator module 5, to a ground receiver separated by an air gap sufficiently large to avoid any high voltage stress conditions on the measuring circuits from the large potential difference between the power line and ground.

The power line voltage measurement is obtained from measuring the leakage or charging current created by the interaction of the alternating electric field created by the high voltage in the power line with the essentially toroidal structure of the outer surface of the module 5. The fixed spacial relationship of the module with respect to the ground plane determines the value of the leakage or charging current.

The potential of the outer shell 2 is forced to be within a fraction of a volt from the power line voltage by the effect of the electronic circuits within the module. The leakage current flowing from the conductive outer surface of the toroidal module to ground is essentially proportional to the potential difference between the power line and ground. Since the outer shell of module 5 is essentially at the same voltage as power conductor 3, any change in voltage in conductor 3 wil be reflected as a change in charging current flowing from module 5 to ground.

Therefore, a prior knowledge of the ratio of change in charging current with respect to change in power line voltage will allow the circuits of the module to transform the measured leakage current into an accurate power line voltage reading.

In application Ser. No. 484,681, now U.S. Pat. No. 4,689,752, incorporated herein by reference, long arcuate capacitor plates were embedded in and electrically isolated from the skin of the donut shaped module. This configuration was somewhat susceptible to variation in measurements caused by varying weather conditions, particularly rain and snow.

In the present invention, these problems have been largely overcome by utilizing the entire toroidal case as a charge collecting, capacitor plate. Furthermore, the toroidal case has been DC isolated from the power line conductor by applying a thin hard ceramic coating on the jaws insert. Across this layer of insulation are the inputs to an integrating operational amplifier so configured as to present a very low input impedance across the hard ceramic coating and maintain the voltage difference between the two insulated sides within a fraction of a volt of each other. The charging current flowing from the power line through to the outer skin of the module is forced to pass through the operational amplifier, digitized, and reported as a voltage measurement.

BRIEF DESCRIPTION OF THE DRAWINGS

The same reference characters refer to the same elements throughout the several views of the drawings.

DETAILED DESCRIPTION

Figure 1:
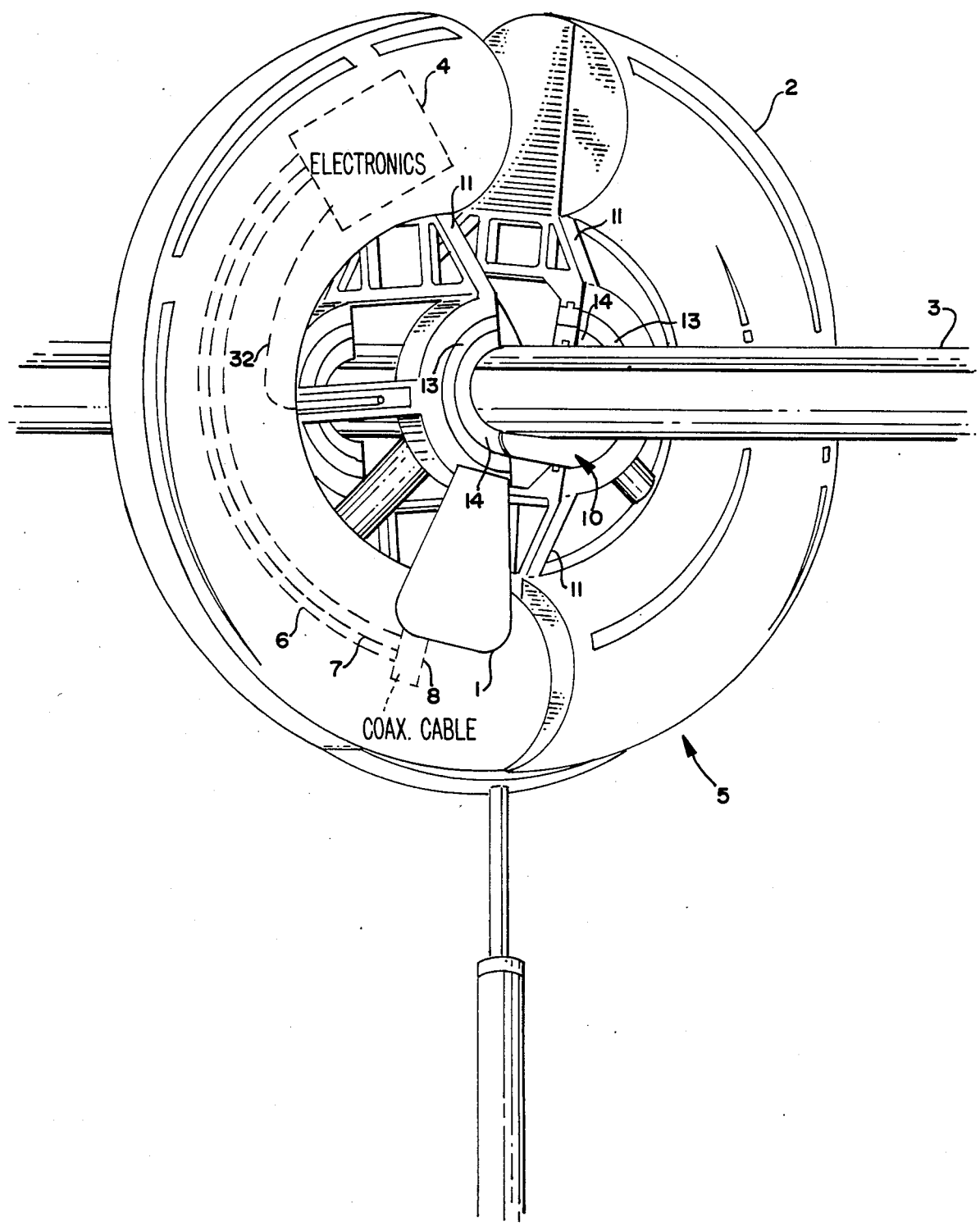
FIG. 1 is a perspective view of apparatus according to the invention for measuring the potential difference between a power conductor and ground.
Figure 2:
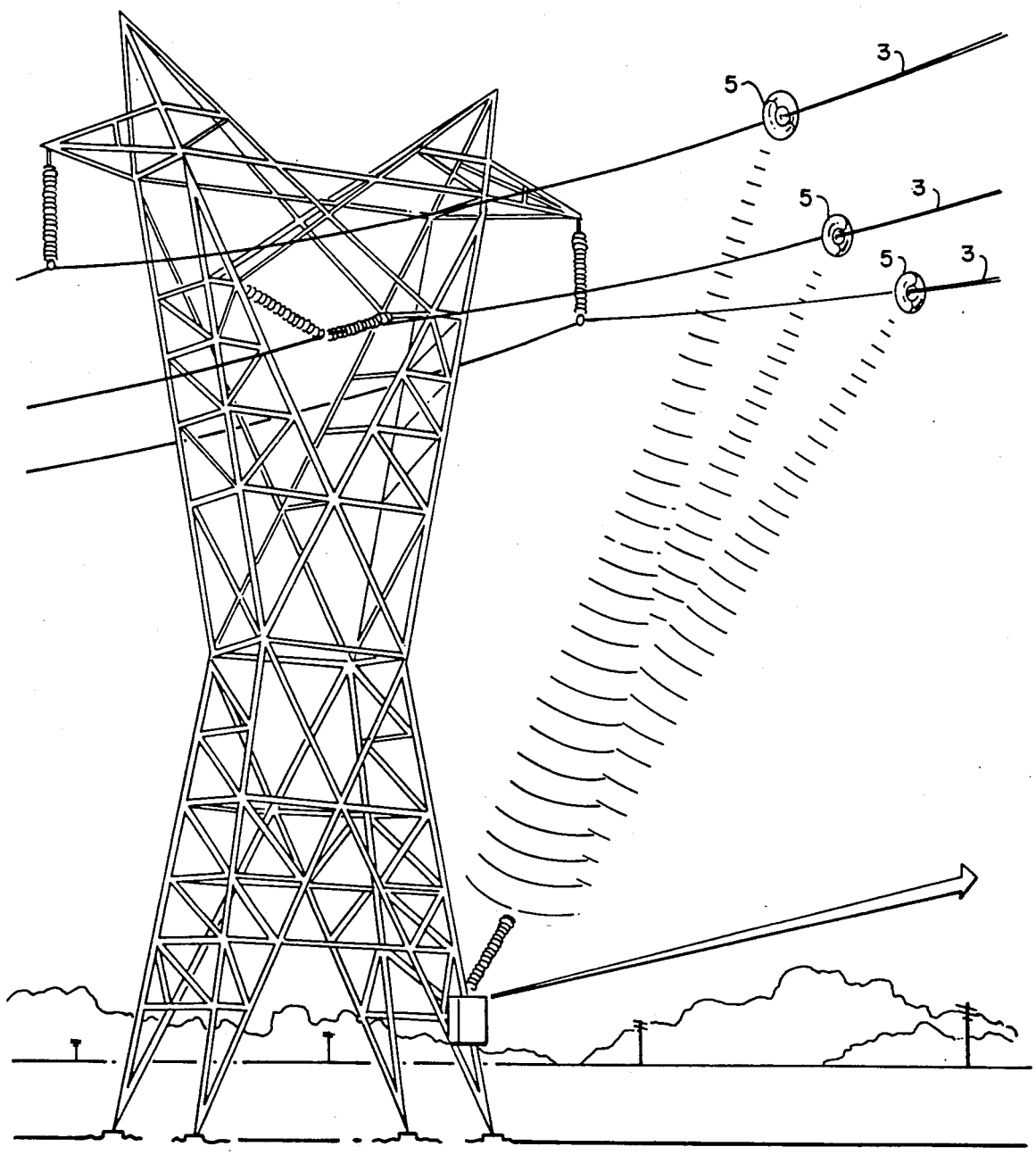
FIG. 2 is a perspective view showing how three modules as shown in FIG. 1 may be mounted to the three conductors typically associated with a three phase power circuit of a power line.
Figure 3:
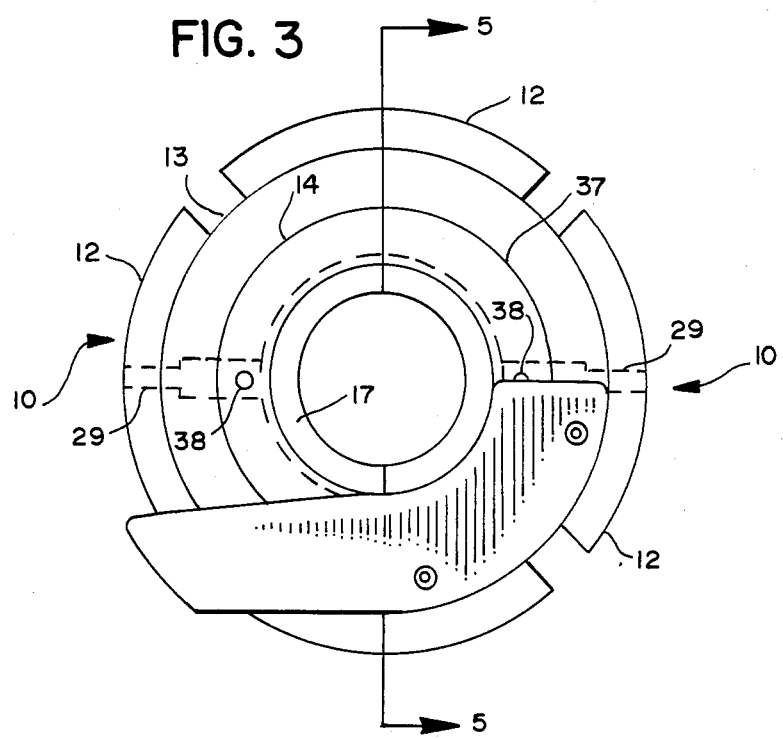
FIG. 3 is a front view, partially in phantom, of the jaws inserts according to the invention for the hub of the toroidal module where it contacts the power line conductor.

A hot stick mounted voltage sensor generally indicated at 5 is shown in FIG. 1. The module 5 is generally of a toroidal shape. It comprises a housing 2 to which a jaws assembly, generally indicated at 10, is secured via open radial webs 11. An R.F. impedance matching network 1 is mounted near the assembly 10, and is connected via associated coaxial cable parts 6, 7, and 8 to a shielded transmitter and to electronics 4 inside the module 5. Conductor 32 is connected as described below to the power conductor 3 and to the electronics module 4.

Module 4 is connected to the outer conducting skin 2 of the module 5.

Mounted in the webs 11 of housing 2 is the power cable clamping jaws assembly 10. The diameter of the internal opening of this assembly is typically chosen for each specific application so as to accommodate different power cables from 0.5 to 2" in diameter.

Figure 5:
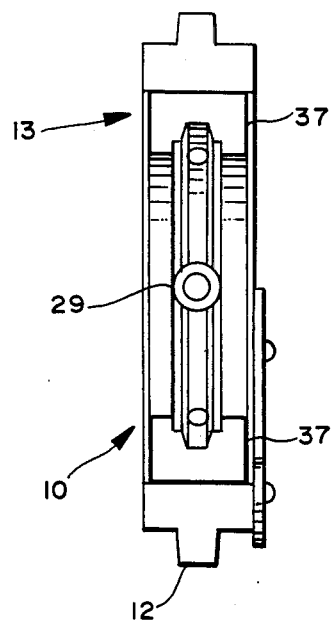
FIG. 5 is a view of one of the jaws inserts taken along the line 5—5 of FIG. 3.
Figure 4:
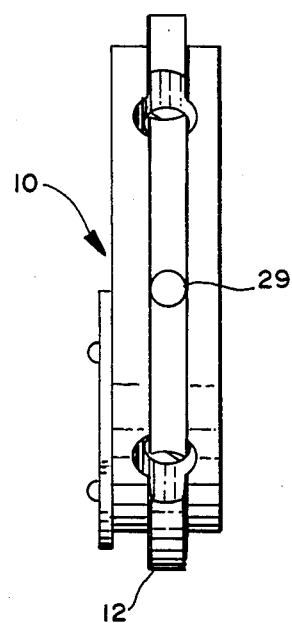
FIG. 4 is a left side view of the jaws insert of FIG. 3.
Figure 6:
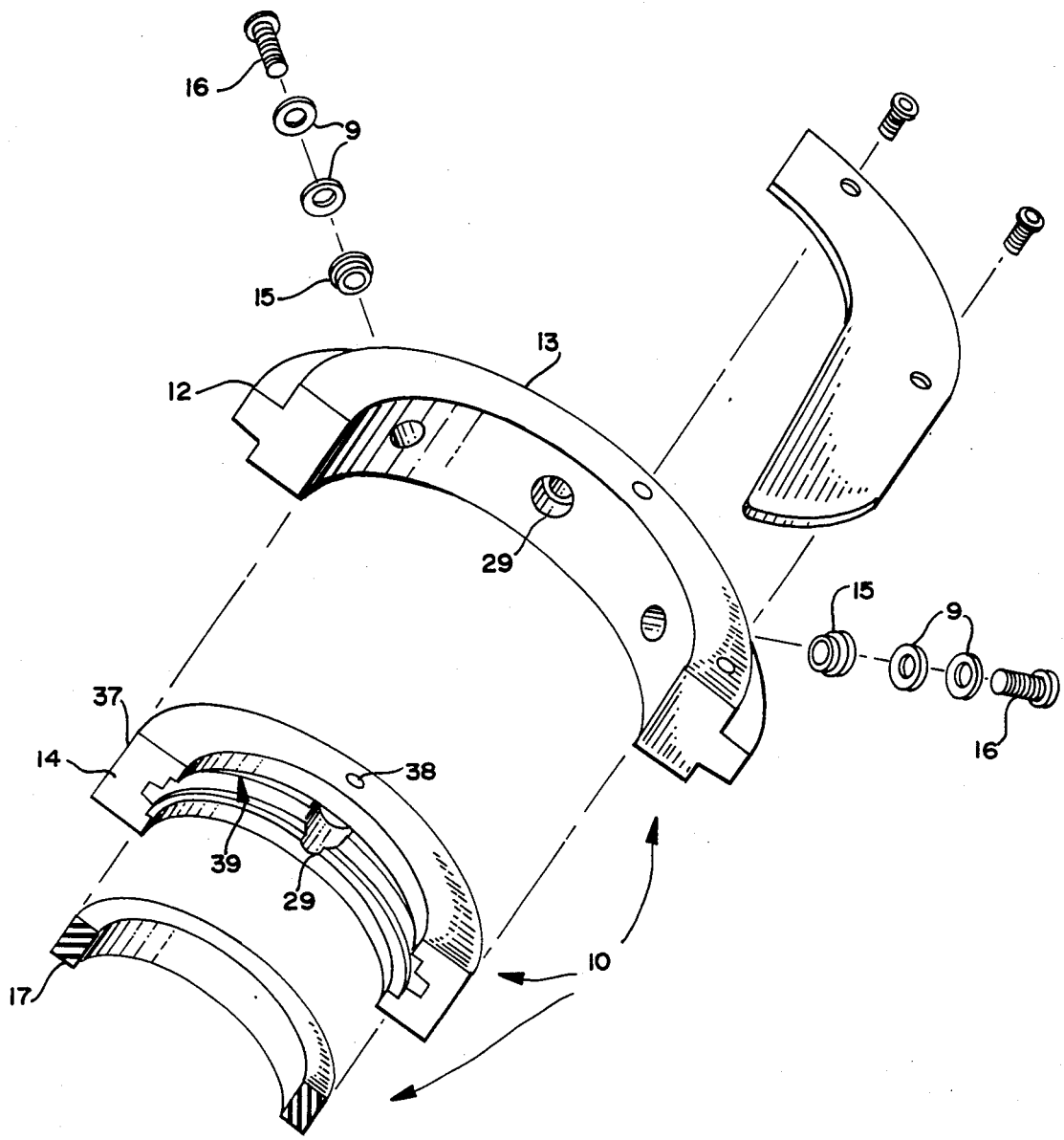
FIG. 6 is an exploded perspective view of one of the jaws inserts of FIG. 5.

The two metal parts and one conductive resilient part of the cable clamping inserts 10 are shown in detail in FIGS. 4, 5 and 6. The three parts are:

(1) Outer half rings 13
(2) Inner half rings 14
(3) Conductive resilient neoprene half ring 17.

Figure 8:
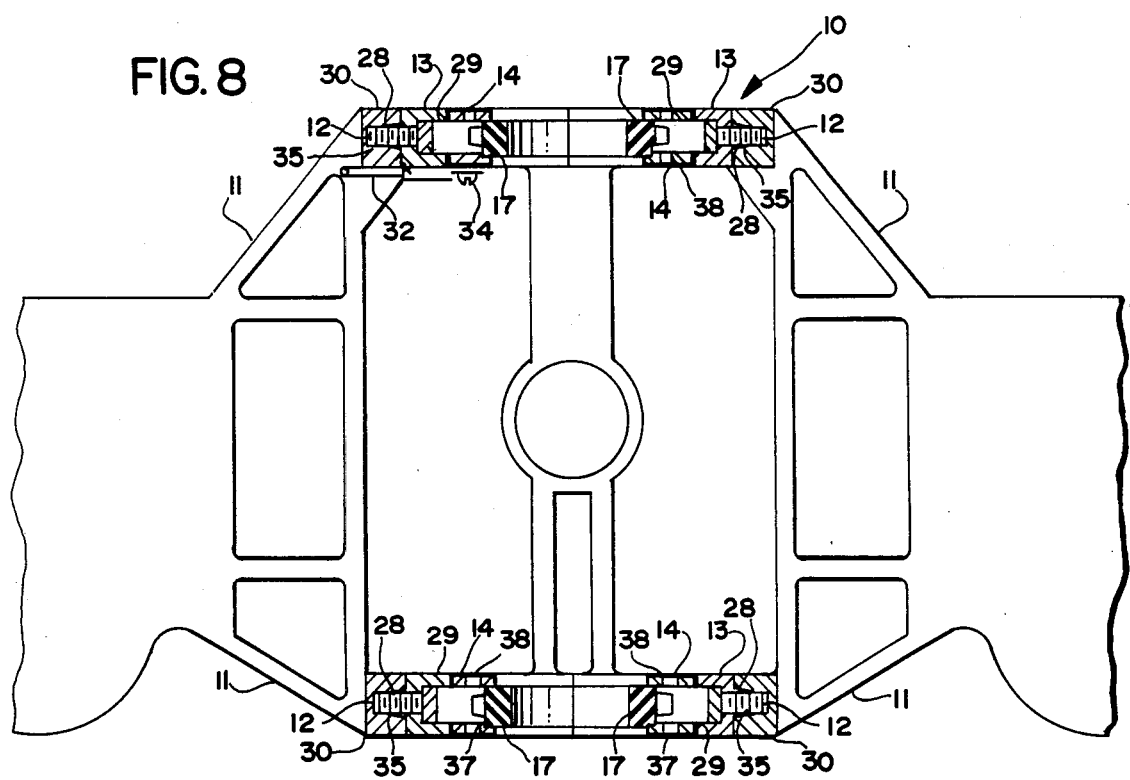
FIG. 8 is a partial cross sectional view taken along the line 8—8 of FIG. 7.

The outer ridge 12 of each of the two outer half rings 13 shown in FIGS. 4 and 5 engage a similarly machined groove in the adjacent ring 30 of the hub of housing 2 (see FIG. 8).

Figure 9:
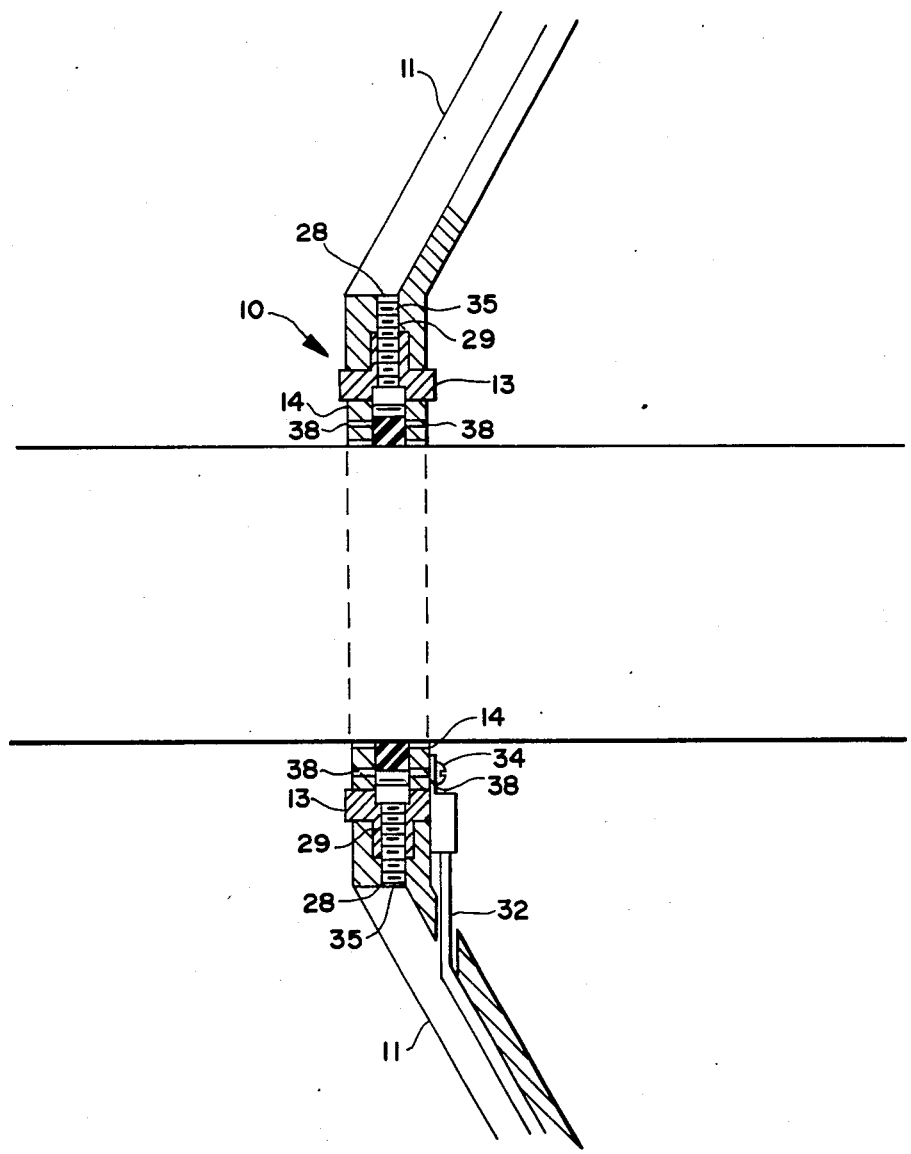
FIG. 9 is a partial cross sectional view similar to FIG. 8 showing the connection between the voltage sensor and the structure contacting the power conductor.

Within outer half rings 13 fit inner half rings 14 as shown in FIG. 6. The inner half rings 14 (to which conductor 32 is connected as shown in FIG. 9) are electrically insulated from the outer half rings 13 by a hard coat insulating ceramic coating 37 on the outer surfaces of the inner rings 14. This may be formed by an electro deposition process such as anodizing. Alternatively, the coating may be a non-hydroscopic polymer such as the fluorocarbon TEFLON. Referring to FIG. 6, bolts 16 connecting outer rings 13 to inner rings 14 are insulated from contact with outer ring 13 by insulating inserts 15, typically made of some solid fluorocarbon such as TEFLON. This insert can tolerate the stress associated with the fastening action of bolts 16 that keep the outer and inner rings in intimate mechanical contact.

A graphite filled, conducting neoprene half ring 17 shown in FIG. 6, is shaped so as to resiliently fit within the machined uninsulated space 39 of inner half ring 14 and the power conductor itself. Ring 17 provides a dual function: first, that of conducting a small amount of current to the voltage measuring circuits, and second, that of providing the mechanical friction for preventing the entire assembly 5 from sliding along the power cable in the event of a strong wind.

The electrical lead 32 from voltage sensing circuits is attached to the inner half ring 14 by screw 34 fitted into tapped hole 38 as shown in FIGS. 6 and 9.

Half ring 14 is fastened to half ring 13 by bolts 16 as shown in FIG. 6. Bolts 16 are insulated from the conductive body of 13 by insulators 15 and washers 9. The insulation of bolts 16 ensures that the effectiveness of hardcoat insulation 37 is preserved and that no low resistance path exists between half rings 13 and 14.

Figure 7:
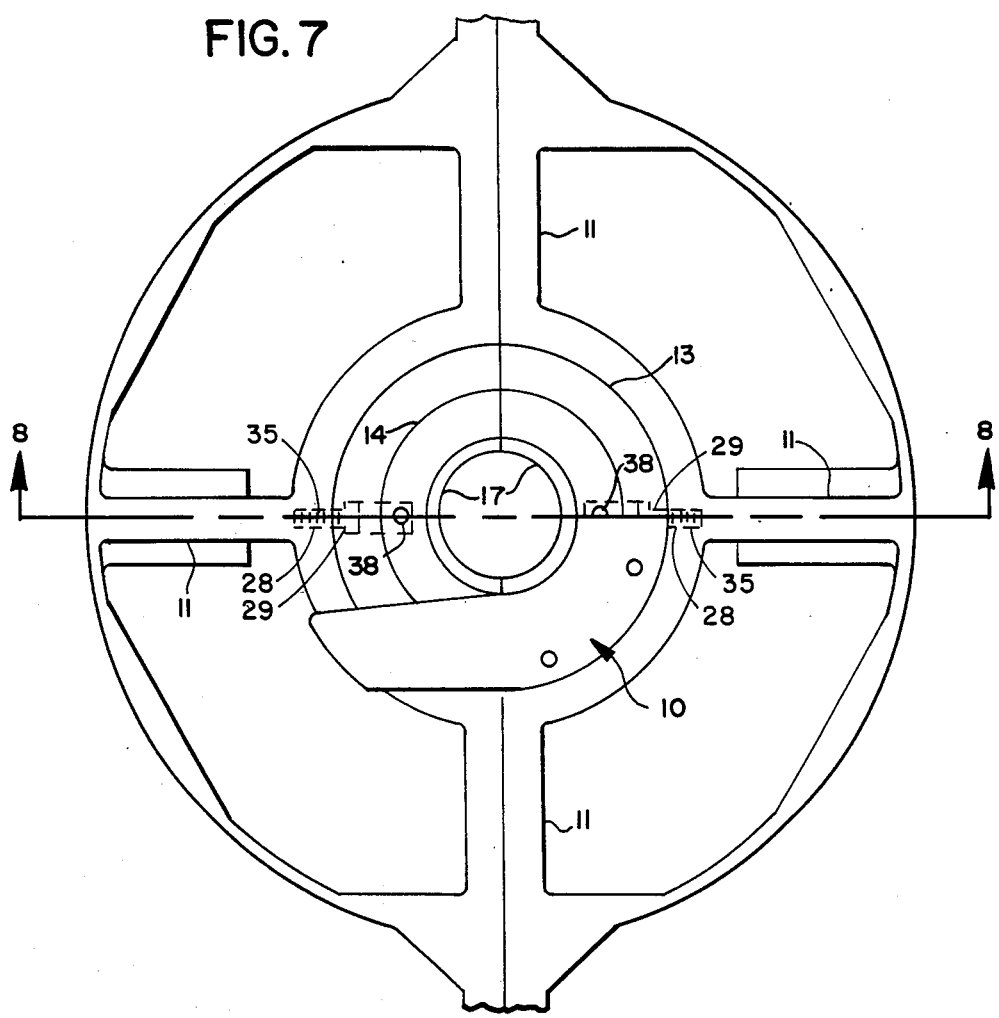
FIG. 7 is a front view, partially cut away, of the jaws inserts of FIG. 3 inserted in the hub of the toroidal module of FIG. 1.

Half ring 13 is fastened onto ring 30 which is part of web structure 11, by bolts 35 (FIGS. 7 and 8). Bolts 35 are inserted after half ring 14 is attached to half ring 13 through clearance hole 29. Bolts 35 engage threaded hole 28 in ring 30 of web 11. Since the bottom part of clearance hole 29 has a smaller diameter than the top part, a shoulder is formed where the head of bolts 35 press against the body of ring 13 to fasten it against ring 30. The action of bolts 35 precludes any motion of machined surface 12 within the receptor ring 30.

Figure 11:
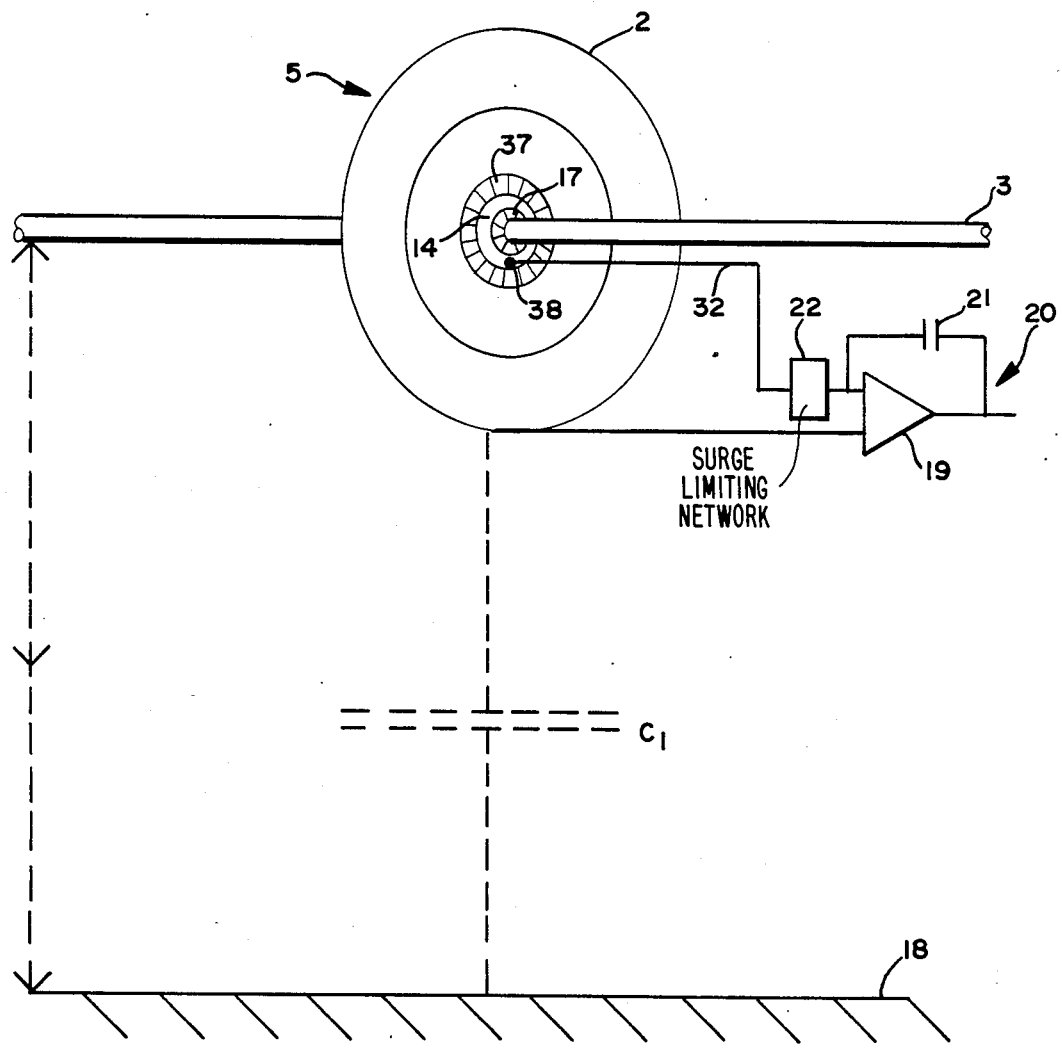
FIGS. 11 and 12 are diagrammatic representations of the electrical relationship between the various electronic elements used in sensing the potential difference between the power line and ground.
Figure 12:
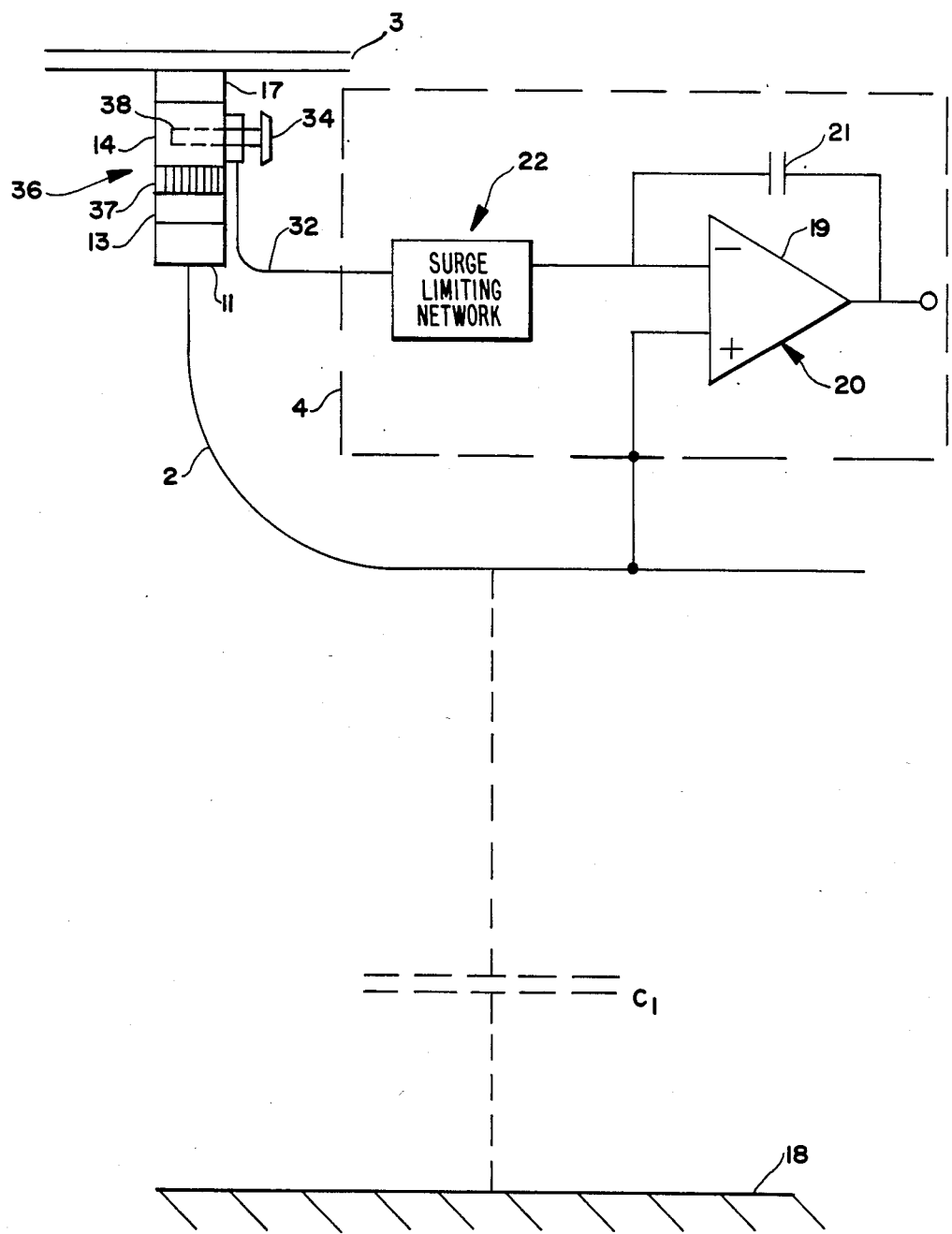

The operation of the voltage sensing circuits may be understood with reference to FIGS. 11 and 12. In FIG. 11 it is desired to measure the potential difference V between power conductor 3 and ground 18. The outer skin 2 of the module 5 forms a capacitor $C_1$ between itself and ground. An integrator, generally indicated at 20, consisting of operational amplifier 19 and capacitor 21 is connected between the power conductor 3 and outer skin 2 of module.

The low input impedance of integrating configuration of operational amplifier 19, and its high gain ensures that the potential of outer skin 2 is very nearly the same as that of conductor 3. Now the potential between outer skin 2 and ground 18 is the potential V between ground 18 and high voltage conductor 3. Therefore, the current in equivalent capacitance $C_1$ is now directly proportional to the voltage V. Therefore, the current output of the low input impedance integrator formed by operational amplifier 19 and integrating capacitor 21 will provide an AC output voltage exactly proportional to the current in capacitance $C_1$ and thus directly proportional to the high voltage V between conductor 3 and ground 18.

Now referring to FIG. 12, all of the circuitry needed to perform the voltage conversion and the mechanical structure associated with these components is shown diagrammatically. All of the circuitry included in the integrator connected operational amplifier 20 is mounted within a metal housing 4 internal to the toroidal module 5, also shown in FIG. 1. Housing 4 is mechanically and electrically connected to the outer skin 2 of the module 5. The non-inverting side of the operational amplifier 19 is connected directly to the metal housing 4, while the inverting side is connected to a surge limiting network 22 whose input is connected to the power line via wire lead 32, bolt 34 mounted into tapped hole 38, the metal body of ring 14 and conductive neoprene rings 17. Outer case 2 of the toroidal module 5 is insulated from power line conductor 3 by the interposition of hard coat insulation 37 between rings 13 and 14. This insulation forces any electrical charge flowing from conductor 3 through skin 2 to ground 18 to pass through integrator 20. The capacitance 36 formed across insulation 37 by the presence of metal rings 13 and 14 is shunted by the low input impedance of integrator 20. Therefore, at low operating frequencies of a few hundred Hertz, as typically found on power lines, capacitor 36 appears as a virtual open circuit across the very low input impedance of integrator 20. The action of the integrator 20 is to force the voltage across insulator 37 and therefore capacitance 36 to a fraction of a volt.

Figure 10:
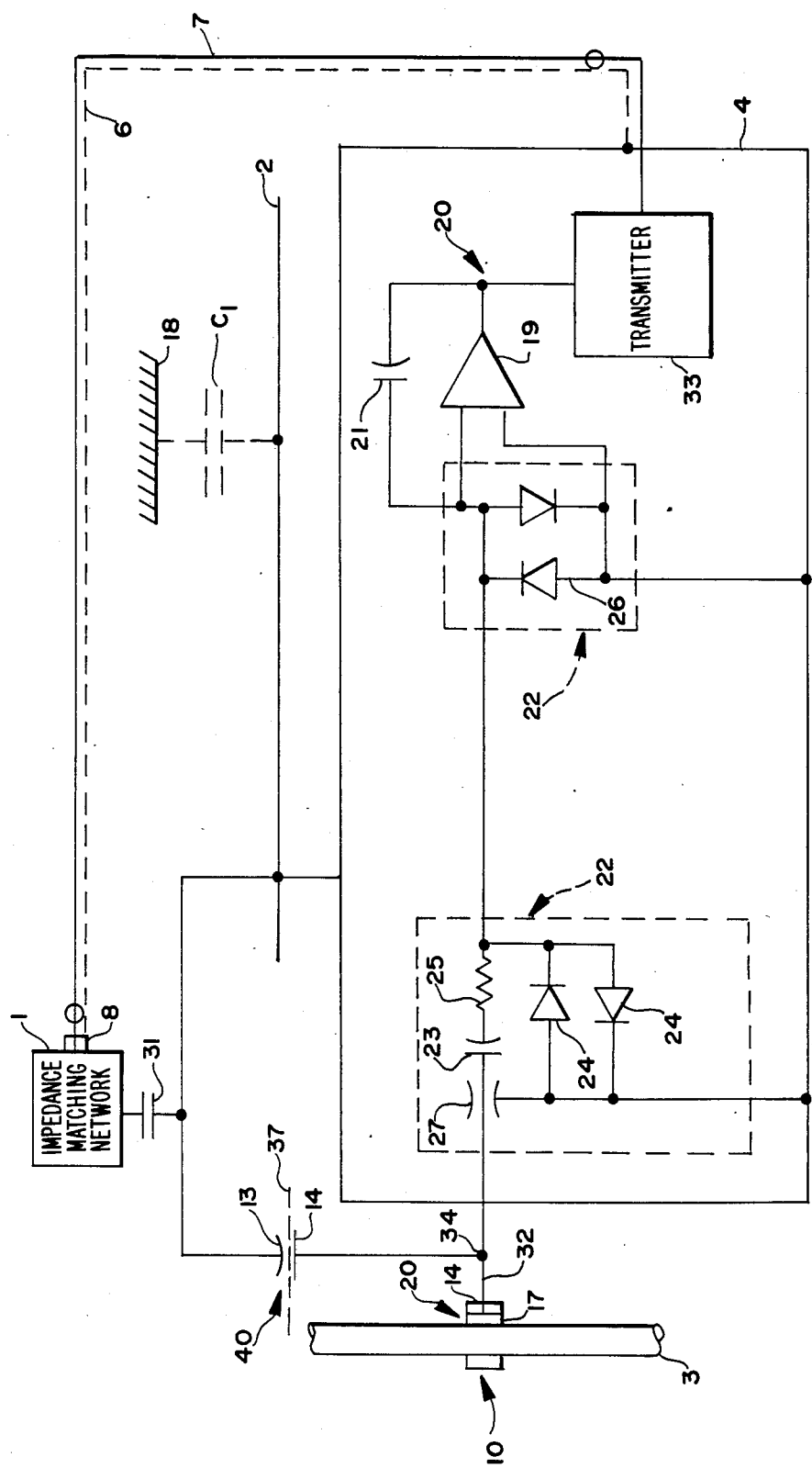
FIG. 10 is a schematic electrical circuit diagram of the circuits contained within the module shown in FIG. 1.

FIG. 10 gives further detail about the structure of the surge limiting network 22 comprising:
(1) a non-polar electrolytic direct current (DC) blocking capacitor 23 to block any stray DC current components;
(2) a current limiting resistor 25 chosen to limit the current through diodes 26 in the event of voltage surges, typically 100 ohms;
(3) two crossconnected clamping diodes 24 such as a 1N4003 to prevent voltage surges across resistor 25 from exceeding about 1 volt;
(4) a feedthrough capacitor 27 designed to shunt to ground fast risetime voltage surges of either polarity.

The capacitance formed by the insulation 37 between half rings 13 and 14 in FIGS. 8 and 9 is shown in FIG. 10 as equivalent capacitor 40. The function of this capacitor is to couple the outer skin 2 of the module 5 and power conductor 3 at high frequencies such as those put out by transmitter 33, through coaxial cable components 6, 7, connector 8, and into space via an impedance matching network 1. Capacitance 31 is created by the proximity of the impedance matching network to the outer skin 2 of module 5 and is used to resonate the outer skin 2 at the frequency of interest, typically 950 MHZ. Note that the presence of capacitor 40 does not influence the current to voltage conversion function of operational amplifier 19 or the accuracy of its voltage measuring function.

The DC and low frequency insulating characteristic of capacitor 40 forces all leakage current from the outer skin of the module to ground at the power line operation frequency to flow through operational amplifier 19 so it may be transformed into a voltage to be digitized. Since the integrator 20 forces the low power line frequency voltage across capacitance 40 to be only a fraction of a volt, and capacitance 36 is shunted by the low input impedance looking into integrator 20, capacitance 36 has a negligible influence on the voltage measurement function.

It will thus be seen that the objects set forth above, among those made apparent from the preceding description, are efficiently attained and, since certain changes may be made in the above construction without departing from the scope of the invention, it is intended that all matter contained in the above description, or shown in the accompanying drawings, shall be interpreted as illustrative and not in the limiting sense.

We claim:

1. Apparatus for measuring voltage on an above ground power line conductor comprising:
   an electrically conductive housing attached to said above ground conductor,
   mounting means for attaching said housing to said conductor,
   said mounting means including a first conductive portion in electrical contact with said conductor, a second conductive portion in electrical contact with said housing, and electrical insulating means separating said first and second portions,
   and low impedance current measuring means, said measuring means electrically connected to said first conductive portion and to said housing whereby said housing acts as a charge collecting plate and said measuring means measures current flowing from said conductor to said housing, said current being proportional to the voltage on said power line conductor.

2. Apparatus as defined in claim 1 wherein said mounting means comprises:
   a pair of arcuate nested metal parts including an outer ring and an inner ring fitting within said outer ring; and
   a film of insulating material affixed to said inner ring to electrically insulate said inner ring from said outer ring.

3. Apparatus as defined in claim 2 wherein said film is a hard coat ceramic.

4. Apparatus as defined in claim 2 wherein said film is a polymer.

5. Apparatus as defined in claim 4 wherein said film is a fluorocarbon.

6. Apparatus as defined in claim 2 further including a conductive neoprene insert fitting in said inner ring and contacting said conductor when said housing is mounted on said conductor.

7. Apparatus as defined in claim 1 wherein said housing is generally toroidal in shape and surrounds said conductor when mounted on said conductor.

8. Apparatus as defined in claim 1 wherein said measuring means comprises an operational amplifier with first and second inputs.

9. Apparatus as defined in claim 8 further including a surge suppressing network connected between said first amplifier input and said conductor, said second amplifier input connected to said housing.

10. Apparatus as defined in claim 8 wherein said operational amplifier is configured as an integrator.

* * * * *